(12) United States Patent
Mauer et al.

(10) Patent No.: US 8,914,716 B2
(45) Date of Patent: Dec. 16, 2014

(54) RESOURCE SHARING IN DECODER ARCHITECTURES

(75) Inventors: Volker Mauer, Princes Risborough (GB); Zhengjun Pan, High Wycombe (GB)

(73) Assignee: Altera Corporation, San Jose, CA (US)

( * ) Notice: Subject to any disclaimer, the term of this patent is extended or adjusted under 35 U.S.C. 154(b) by 1176 days.

(21) Appl. No.: 12/341,091

(22) Filed: Dec. 22, 2008

(65) Prior Publication Data

US 2009/0228768 A1    Sep. 10, 2009

(30) Foreign Application Priority Data

Mar. 6, 2008 (GB) .................................. 0804206.1

(51) Int. Cl.
*H03M 13/03* (2006.01)
*H03M 13/39* (2006.01)
*H03M 13/00* (2006.01)

(52) U.S. Cl.
CPC ...... *H03M 13/3922* (2013.01); *H03M 13/3972* (2013.01); *H03M 13/6583* (2013.01)
USPC ........... 714/792; 714/786; 714/794; 714/795; 714/796; 375/341

(58) Field of Classification Search
None
See application file for complete search history.

(56) References Cited

U.S. PATENT DOCUMENTS

| | | | |
|---|---|---|---|
| 6,189,126 B1* | 2/2001 | Ulmer et al. .................. | 714/795 |
| 6,754,290 B1 | 6/2004 | Halter | |
| 6,813,743 B1 | 11/2004 | Eidson | |
| 7,613,990 B1* | 11/2009 | Wilkie et al. .................. | 714/796 |
| 2001/0021233 A1* | 9/2001 | Jin ................................. | 375/341 |
| 2002/0007474 A1 | 1/2002 | Fujita et al. | |
| 2002/0097816 A1 | 7/2002 | Sim | |
| 2002/0118777 A1 | 8/2002 | Blankenship et al. | |
| 2003/0028846 A1* | 2/2003 | Garrett .......................... | 714/796 |
| 2003/0149928 A1 | 8/2003 | Ting et al. | |
| 2004/0025103 A1 | 2/2004 | Obuchii et al. | |
| 2005/0157823 A1* | 7/2005 | Sudhakar ...................... | 375/341 |
| 2005/0172204 A1 | 8/2005 | Lin | |

(Continued)

OTHER PUBLICATIONS

Sadjadpour, Hamid R., Maximum a posteriori decoding algorithms for turbo codes, Jul. 2000, Proc. SPIE vol. 4045, p. 73-83, Digital Wireless Communication II, Raghuveer M. Rao; Soheil A. Dianat; Michael D. Zoltowski; Eds.*

(Continued)

*Primary Examiner* — Justin R Knapp
(74) *Attorney, Agent, or Firm* — Mauriel Kapouytian Woods LLP; Ararat Kapouytian

(57) ABSTRACT

A state metric calculator for calculating state metrics of stages in a trellis of a sequence estimation technique is described. The calculator has a processing path containing operations needed for calculating a state metric of a trellis stage from state metrics of an earlier trellis stage. One or more data stores are located in the processing path to divide the path into separate sections. The sections can then operate on the production of different state metrics to one another in, if desired, the same clock cycle.

23 Claims, 13 Drawing Sheets

(56) References Cited

U.S. PATENT DOCUMENTS

| | | | |
|---|---|---|---|
| 2006/0005111 A1* | 1/2006 | Hepler et al. | 714/796 |
| 2007/0030926 A1* | 2/2007 | Brown et al. | 375/340 |
| 2007/0044008 A1* | 2/2007 | Chen et al. | 714/795 |
| 2007/0055919 A1* | 3/2007 | Li et al. | 714/755 |
| 2007/0157066 A1* | 7/2007 | Concil et al. | 714/759 |
| 2007/0177696 A1 | 8/2007 | Chen et al. | |
| 2008/0092011 A1 | 4/2008 | Ikeda | |
| 2008/0152045 A1* | 6/2008 | Efimov et al. | 375/341 |
| 2009/0132896 A1* | 5/2009 | Valadon | 714/792 |
| 2009/0319862 A1 | 12/2009 | Nguyen | |
| 2010/0054375 A1* | 3/2010 | Lo et al. | 375/341 |
| 2011/0047436 A1* | 2/2011 | Lee et al. | 714/755 |
| 2011/0271166 A1 | 11/2011 | Hepler et al. | |

OTHER PUBLICATIONS

Montorsi, G. "Design of Fixed-Point Iterative Decoders for Concatenated Codes with Interleavers," IEEE Journal on Selected Areas in Communications, May 2001, vol. 19, No. 5., pp. 871-882.

U.S. Appl. No. 12/339,482, filed Dec. 19, 2008, Pan et al.

Gambe, H. et al. "An Improved Sliding Window Algorithm for Max-Log-MAP Turbo Decoder and Its Programmable LSI Implementation," IEICE Trans. Electron., Mar. 2005, vol. E88-C, No. 3, pp. 403-412.

* cited by examiner

US 8,914,716 B2

RESOURCE SHARING IN DECODER ARCHITECTURES

BACKGROUND

The invention relates to the decoding of encoded data.

When data is moved from place to place, it is often the case that the transfer process will create errors in the data. Accordingly, it is common practice to encode data to mitigate the impact of errors introduced by a transfer process. Normally, encoded data has to be decoded in order to be put to its intended use. Both the encoding and decoding of data represent a processing burden. This burden can be quite heavy in the case of modern encoding schemes. The use of encoding schemes to protect against data transfer errors is widespread but such use is particularly heavy in the telecommunications industry, especially in the wireless communications sector.

There exists a wide range of data encoding techniques and complimentary data decoding techniques. In the wireless communications sector, convolutional encoding techniques are commonly used. Various techniques can be used for decoding a convolutionally encoded signal, such as the Viterbi algorithm, the MAP (maximum a posteriori probability) algorithm and the logMAP algorithm. Convolutional encoding and Viterbi, MAP, logMAP and max-logMAP decoding algorithms will be well known to those skilled in the art of wireless telecommunications engineering but readers less familiar with the field can find an introduction to these subjects in the book entitled "Digital Communications", by John G. Proakis, fourth edition, published by McGraw-Hill.

SUMMARY

According to one aspect, an embodiment of the invention provides a state metric calculator for calculating state metrics of stages of a trellis of a sequence estimation technique, such as a MAP or logMAP algorithm. The calculator includes a processing path containing operations needed for calculating a state metric of a trellis stage from state metrics of an earlier trellis stage. There is at least one data store in the processing path so that the path is partitioned into sections that are arranged to operate on the calculation of different state metrics to one another.

Thus, a state metric calculator is provided that has the capacity to work on several state metrics. The calculator may, for example, be arranged to work on different state metrics in the same clock cycle.

One of the sections may, for example, be arranged to select a best candidate for a state metric of the trellis. That section may, for example, produce the candidates from branch metrics and state metrics for the earlier stage.

One of the sections may, for example, be arranged to correct inaccuracy in a candidate nominated to be the state metric under calculation. That section may, for example, apply a correction from a look up table or other storage. That section may, for example, scale the nominated candidate by a factor.

The operations in the processing path may, for example, relate to the calculation of an α metric or a β metric for a MAP, logMAP, max-logMAP sequence estimation technique or a state metric for a soft output Viterbi algorithm (SOVA) sequence estimation technique.

The calculator may, for example, form part of a sequence estimator such as a constituent decoder in a turbo decoder, some other convolutional decoder (such as a hard output Viterbi decoder) or sequence estimator (such as a Viterbi equaliser).

The calculator may, for example, be implemented in an application specific integrated circuit (ASIC) or a field programmable gate array (FPGA).

According to a further aspect, an embodiment of the invention provides a state metric calculator for calculating a state metric of a stage of a trellis having a plurality of stages and relating to a sequence estimation technique. The calculator includes a set of processing elements and at least one register. The processing elements are arranged to take data from a trellis stage and produce a state metric for the subsequent stage of the trellis. At least one register is connected between two of the processing elements to divide the set into subsets that are capable of working on the production of different state metrics of the subsequent stage to one another in a given clock cycle.

According to another aspect, an embodiment of the invention provides a state metric calculator that is pipelined to enable different parts of the calculator to be working on different state metrics at the same time.

According to yet another aspect, an embodiment of the invention provides a data sequence estimator for estimating a transmitted data sequence using a trellis calculation technique utilising a trellis comprising a set of stages each containing a number of states. The estimator includes a plurality of state metric calculators. Each of a set of at least two of the state metric calculators comprises a processing path containing operations needed for calculating a state metric of a trellis stage from state metrics of an earlier trellis stage and at least one data store in the processing path so that the path is partitioned into sections that are arranged to operate on the calculation of different state metrics to one another. Each calculator in the set is arranged to produce, in one clock cycle, a state metric for a different state of the same stage of the trellis. Each calculator in the set is arranged such that, in that clock cycle, at least two of its processing path sections work on the calculation of different state metrics to one another.

BRIEF DESCRIPTION OF THE DRAWINGS

The novel features of the invention are set forth in the appended claims. However, for purpose of explanation, several aspects of particular embodiments of the invention are described by reference to the following figures:

DETAILED DESCRIPTION

The following description is presented to enable any person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
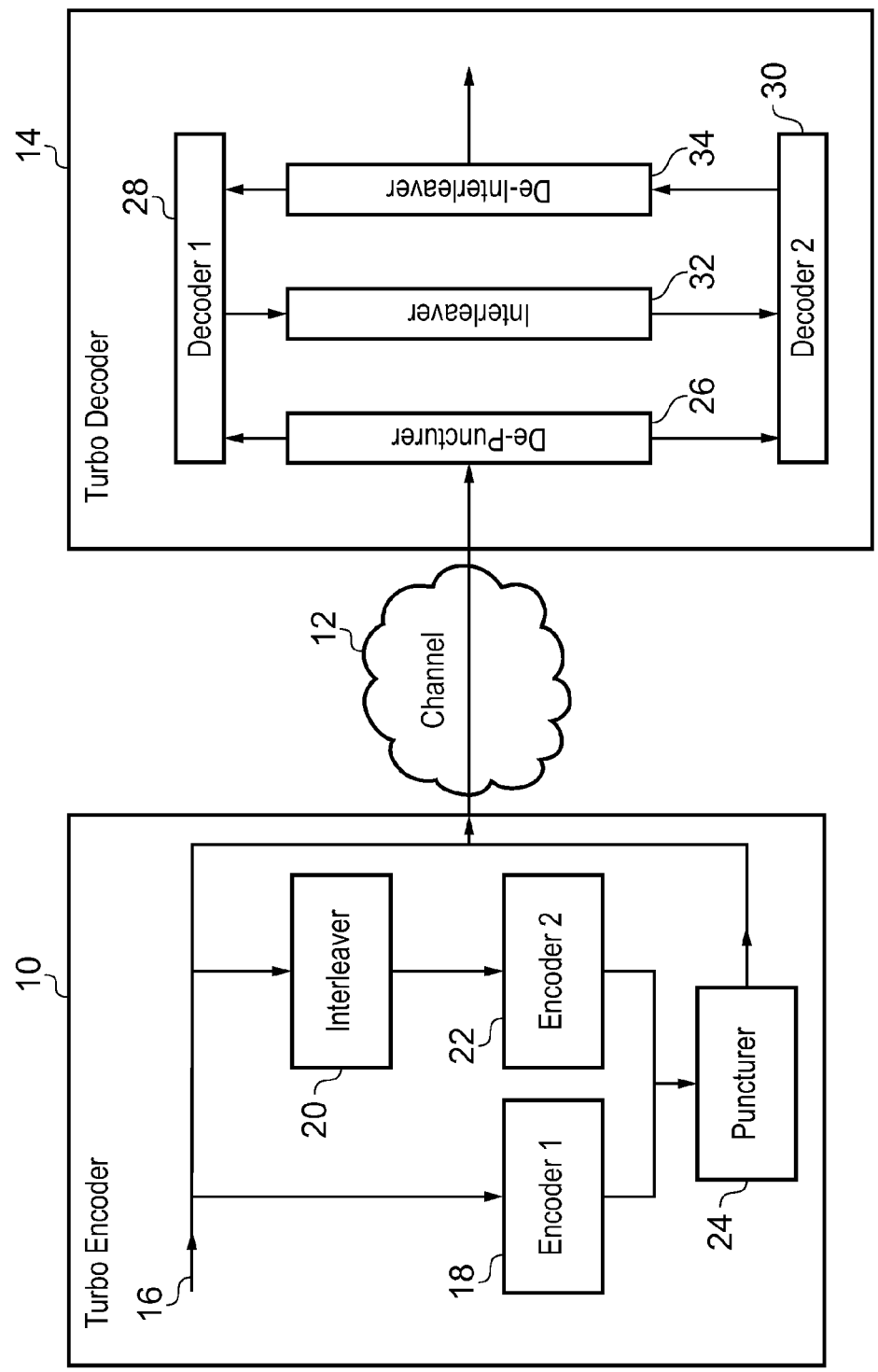
FIG. 1 is a block diagram illustrating schematically a turbo encoder and a turbo decoder.

FIG. 1 illustrates a turbo encoder 10 arranged to transmit a signal through a channel 12 to a turbo decoder 14. In practice, the signal travelling through the channel 12 is, as will be appreciated by persons skilled in the digital communications field, modulated onto a radio frequency (RF) carrier signal but the modulation process and the corresponding demodulation process are omitted here for reasons of brevity and clarity. It will also be apparent to the readers skilled in the digital communications field that the elements shown within the encoder 10 and the decoder 14 represent functions that are performed by the encoder or, as the case may be, the decoder and do not necessarily represent actual components. This holds true for most of the elements shown in most of the figures, as the skilled person will appreciate.

In the turbo encoder 10, a signal 16 is encoded for transmission through the channel 12 to the turbo decoder 14. The signal 16 is constituted by a sequence, or block, of bits. The signal 16 is supplied in parallel to a first constituent encoder 18 and to an interleaver 20. The interleaver 20 reorders the data in the signal 16 and supplies the result to a second constituent encoder 22. The constituent encoders 18 and 22 are convolutional encoders. The constituent encoder 18 produces a convolutionally encoded version of the input signal 16 and supplies this convolutionally encoded signal to a puncturer 24. Likewise, constituent encoder 22 convolutionally encodes an interleaved version of the input signal 16 and supplies the resulting convolutionally encoded signal as another input to the puncturer 24. The convolutionally encoded signals that are produced by the constituent encoders 18 and 22 are streams of parity bits that are intended to be transmitted with the signal 16 through the channel 12. The puncturer 24 deletes selected ones of the parity bits produced by the constituent encoders 18 and 22 before the parity information is combined with the signal 16 to produce the signal that is to be transmitted through the channel 12. The puncturer 24 performs the selective deletion of parity bits in accordance with a predetermined policy in order to provide a desired code rate to the signal that is transmitted through the channel 12.

In the turbo decoder 14 the signal acquired from the channel 12 is supplied to a depuncturer 26. The depuncturer 26 pads the signal acquired from the channel 12 with dummy bits in the positions where information was deleted by the puncturer 24 in the turbo encoder 10. The depunctured signal produced by the depuncturer 26 is then supplied in parallel to constituent decoders 28 and 30. The constituent decoder 28 uses the logMAP algorithm to produce an estimate of the signal 16 that was supplied to constituent encoder 18 in the turbo encoder 10. The constituent decoder 30 uses the logMAP algorithm to estimate the interleaved version of signal 16 that is applied to constituent encoder 22 in the turbo encoder 10. The constituent decoders 28 and 30 perform successive estimations of, respectively, the input signals of constituent encoders 18 and 22. Each time constituent decoder 28 produces an estimate of signal 16, the result is interleaved by an interleaver 32 and supplied as an input to constituent decoder 30 to inform the next iteration of the estimation of the signal that is supplied to constituent encoder 22. Likewise, each time the constituent decoder 30 produces an estimate of the signal that is supplied to the constituent encoder 22, the result is deinterleaved by a deinterleaver 34 and is applied to the constituent decoder 28 to inform the next iteration of the estimation of the signal 16. After a certain number of iterations of the decoding processes within constituent decoders 28 and 30, the estimate of signal 16 is deemed to be sufficiently reliable and is released by the turbo decoder 14 to downstream processing units and is put to its intended use.

The constituent decoders 28 and 30 both use the logMAP algorithm and the nature of that algorithm will now be described, in overview, by reference to FIG. 2.

Figure 2:
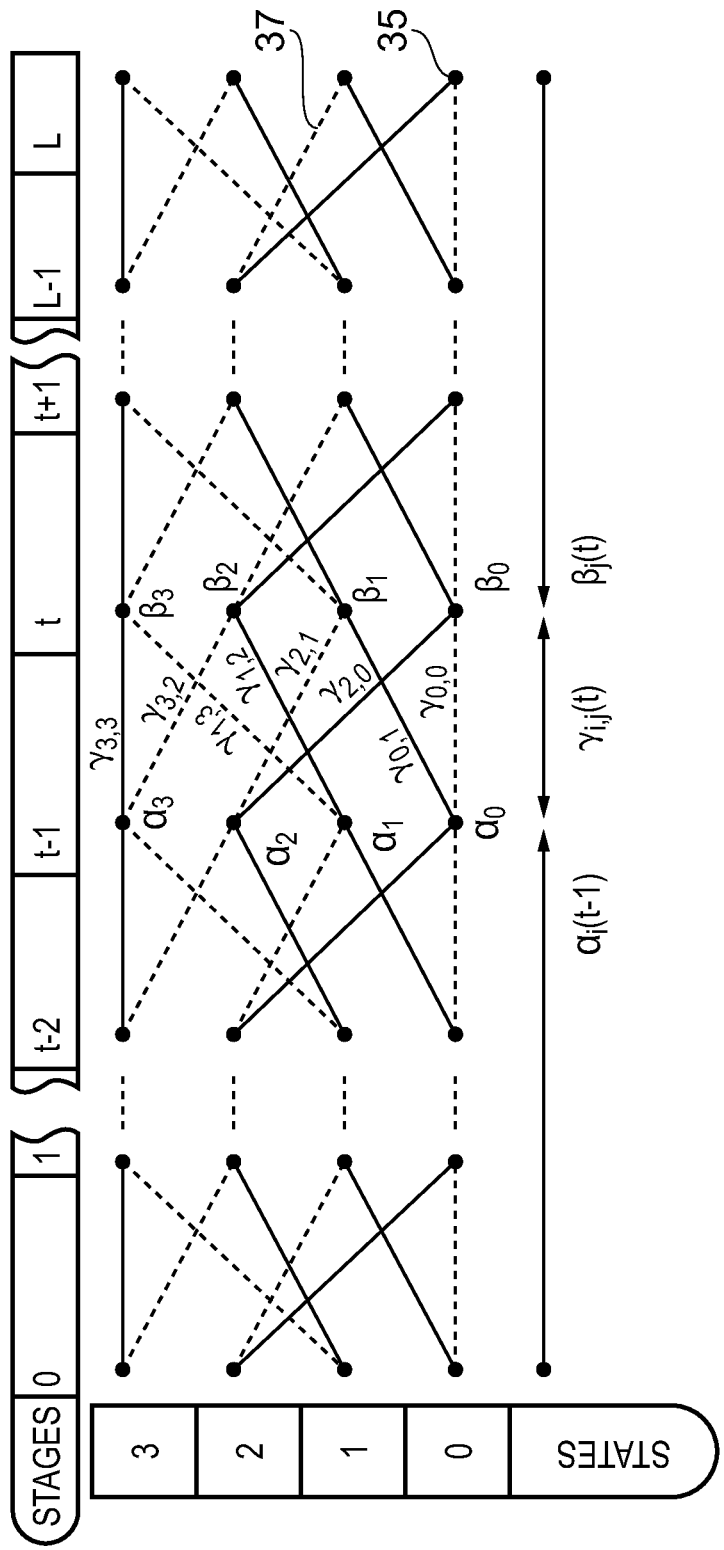
FIG. 2 illustrates a portion of a decoding trellis in an application of the MAP or logMAP algorithm.

FIG. 2 shows a trellis diagram for a sequence of L soft decisions that is an estimate of a sequence of L bits produced by a four state convolutional encoder in response to an initial sequence of L bits. In accordance with accepted convention, the L+1 stages of the trellis are shown horizontally and the four states are shown vertically within each stage, numbered from 0 to 3. To estimate the initial sequence using the logMAP algorithm, so-called $\alpha$ and $\beta$ metrics are calculated, in (natural) logarithmic form, for the nodes in the trellis using branch metics, which are also in (natural) logarithmic form and which are generally indicated $\gamma_{m,n}$ in FIG. 2, with m and n indicating the states in the left-hand and right-hand stages that are connected by the transition to which a branch metric relates. In this document, whenever $\alpha$ metrics, $\beta$ metrics or branch metrics are mentioned henceforth in the context of the logMAP algorithm, it is to be understood that, unless it is expressly stated to the contrary, the metrics are in (natural) logarithmic form. These $\alpha$ and $\beta$ metrics are then used to calculate log likelihood ratios for the bits of the initial sequence.

The $\alpha$ metrics are calculated for the various positions along the trellis in a recursive fashion starting from initial values provided for stage 0 of the trellis, which corresponds to an initial state of the encoder just prior to the application of the first bit of the initial sequence. For each of stages 1 to L, $\alpha$ metrics are calculated for the states by performing so-called metric update operations (MUOs), which use the $\alpha$ metrics of the preceding stage and branch metrics $\gamma_{m,n}$ for the allowed transitions between states in the current and previous stages of the trellis.

The $\beta$ metrics are calculated for the various positions along the trellis in a recursive manner analogous to the calculation of the $\alpha$ metrics but in the opposition direction starting from initial $\beta$ metric values provided for stage L of the trellis, which corresponds to the state of the encoder after receipt of the final bit of the initial sequence.

The production of α metrics for a stage of the trellis from the α metrics of the preceding trellis stage relies on the use of MUOs. Likewise, MUOs are central to updating the β metrics when moving from one trellis stage to another. The conduct of these MUOs will now be explained by reference to the transitions linking stages t and t-1 of the trellis shown in FIG. 2.

The branch metrics for the allowed transitions between the trellis states are evaluated for the transition between stages t and t-1 in a known manner. Each of the α metrics for stage t is calculated from two of these branch metrics and two of the α metrics for stage t-1 in a MUO. Likewise, each of the β metrics for stage t-1 is calculated from two of these branch metrics and two of the β metrics for stage t in a MUO. The details of a MUO for calculating an α or, as the case may be, a β metric from preceding metrics according to the logMAP algorithm will be known to the skilled person and will not be discussed further at this point.

The details of the logMAP algorithm, such as the calculation of the branch metrics and the LLRs, will be known to readers skilled in the art and will not be described here. Now that the general principles of turbo decoding and the logMAP algorithm have been outlined, a receiver making use of these concepts will now be described.

Figure 3:
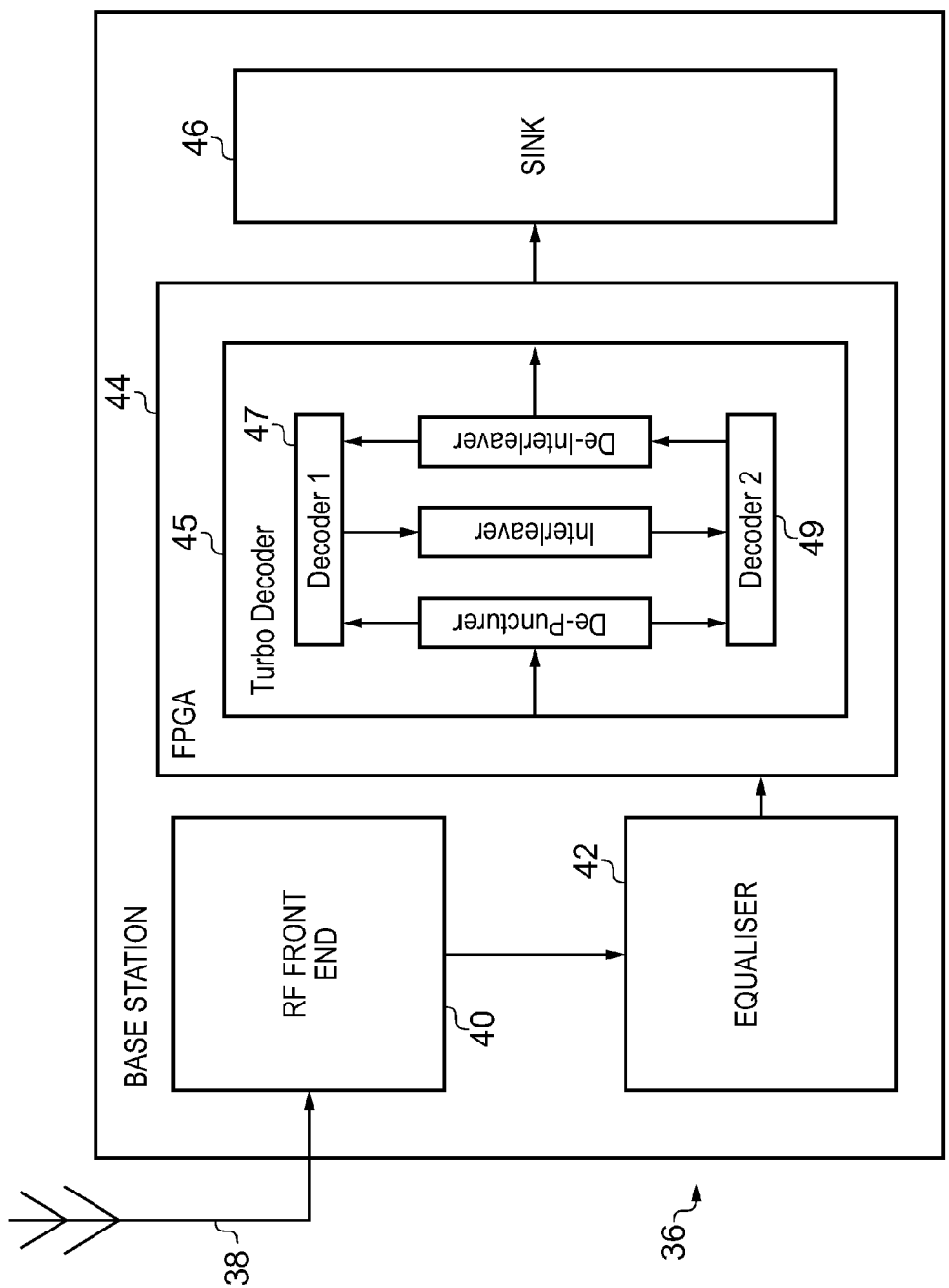
FIG. 3 is a block diagram illustrating schematically a base station, which is in a UMTS (universal mobile telecommunications system) network.

FIG. 3 is a block diagram schematically illustrating a base station 36, which is in a UMTS network (not shown). The base station 36 is shown in FIG. 3 from the perspective of its role as a signal receiver and is shown comprising an antenna 38, an RF front end module 40, an equaliser 42, a field programmable gate array (FPGA) 44 and an information sink 46. In one embodiment, the receiver is a satellite communications receiver. It will be apparent to readers skilled in the digital communications field that elements 40, 42 and 46 shown in FIG. 3 represent functions that are implemented within the base station 36 and do not necessarily correspond directly to actual components of the base station.

Consider the case where the base station 36 is tasked with recovering a data signal that has been turbo encoded and modulated onto an RF carrier signal that has been transmitted over the air to the base station. The antenna 38 picks up radio signals in the vicinity of the base station 36 and supplies them to the RF front end module 40 for processing. The RF front end module 40 uses filtering to isolate the wanted RF carrier signal from amongst the signals collected by the antenna 38. The RF front end module amplifies the isolated RF carrier signal, demodulates it (for example by direct downconversion) and digitally samples the result to produce a series of digital symbols representing an estimate of the turbo encoded data signal. However, this estimate is likely to be affected by intersymbol interference (ISI) arising from multipath propagation of the desired RF carrier signal between its point of origin and the antenna 38. Accordingly, the estimate of the turbo encoded signal is fed through the equaliser 42 which attempts to eliminate any ISI that is present within the estimate of the turbo encoded signal. The equalised estimate of the turbo encoded signal is then supplied from the equaliser 42 to the FPGA 44, which is configured to implement a turbo decoder 45 for estimating the data signal that produced the estimated turbo encoded signal. The recovered data signal is then applied to the information sink 46, where it is put to its intended use, whatever that may be. For example, the information sink 46 may represent an interface to a core network through which the recovered data signal is to be conveyed.

The turbo decoder 45 that is implemented by the FPGA 44 has the same structure as the turbo decoder 14 described with reference to FIG. 1. The constituent decoders 47 and 49 within turbo decoder 45 each employ the logMAP algorithm to generate, in the case of constituent decoder 47, estimates of the data signal that produced the estimated turbo encoded signal and, in the case of constituent decoder 49, estimates of the interleaved version of that data signal. The FPGA 44 is configured to perform the various mathematical functions that are required in the turbo decoder 45 and, in particular, implements four banks of metric calculation units, namely a bank of α metric calculation units (AMCUs) for constituent decoder 47, a bank of β metric calculation units (BMCUs) for constituent decoder 47, a bank of AMCUs for constituent decoder 49 and a bank of BMCUs for constituent decoder 49. All of the AMCUs and BMCUs across the four banks have a common design, which implements the aforementioned MUO and which will now be described by reference to FIG. 4, which shows an AMCU that resides in the bank of AMCUs of constituent decoder 47.

Figure 4:
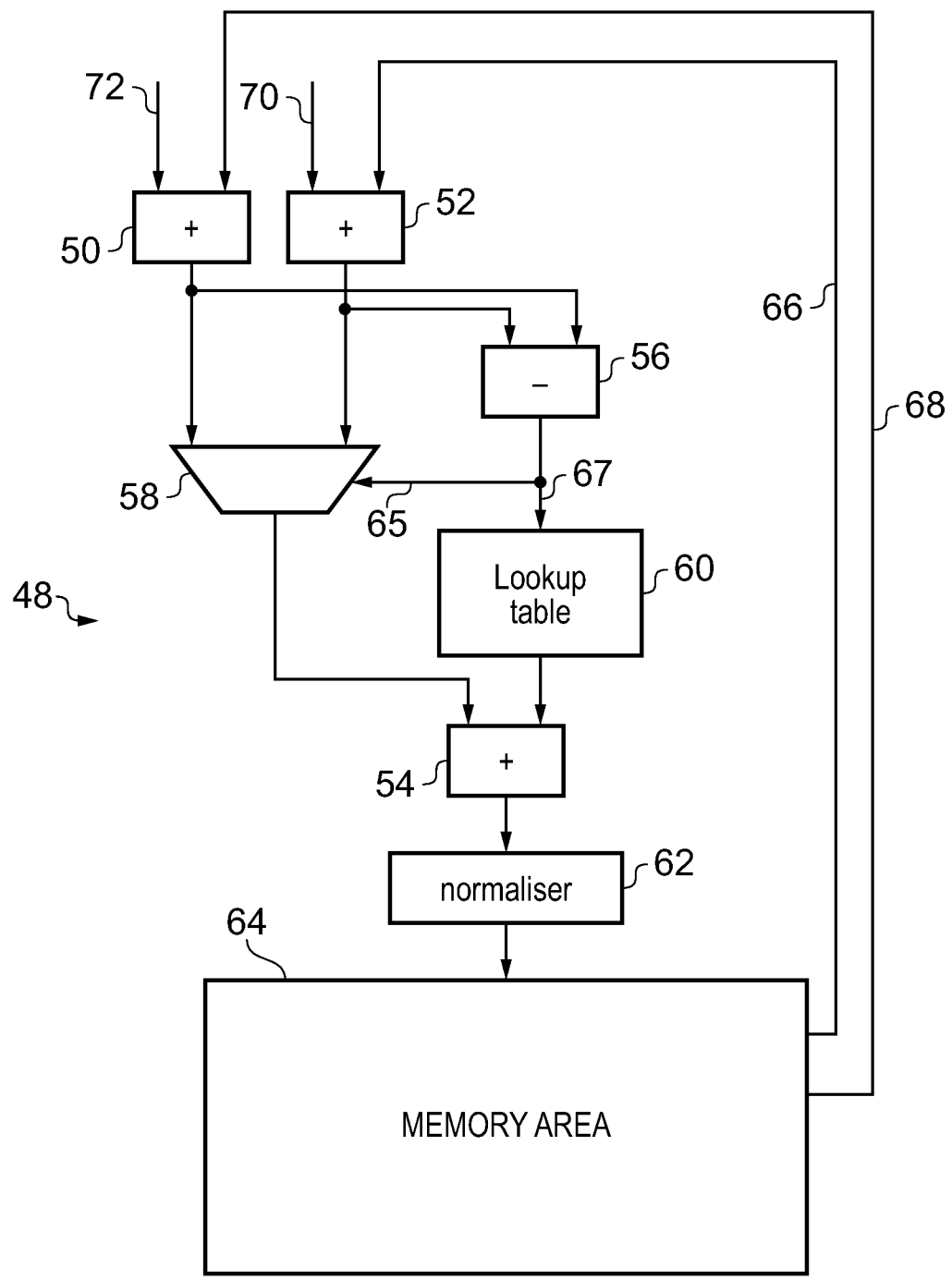
FIG. 4 is a block diagram illustrating schematically a metric calculation core in a constituent decoder within the turbo decoder that is implemented by the FPGA in the base station of FIG. 3.

FIG. 4 is a block diagram illustrating schematically an AMCU 48 that is implemented by the FPGA 44 for turbo decoder 45 in the case where each symbol in the estimated sequence produced by the RF front end module 40 is a soft bit (i.e., it adopts one of two possible states with a confidence level describing the probability of occupation in the adopted state). The adaptation of the unit 48 to the case where these soft symbols have more than two states will be apparent to readers skilled in the art of digital communications. The AMCU 48 includes three adders 50, 52 and 54, a subtractor 56, a multiplexer 58, a look-up table (LUT) 60, and a normaliser 62 and is connected to a memory area 64 within the FPGA 44.

The memory area 64 contains the α metrics for the initial stage of the trellis to which the AMCU 48 is being applied (this would be stage 0 in the case of the FIG. 2 trellis) and stores α metrics that are calculated by the AMCU 48 for subsequent trellis stages. The AMCU 48 is arranged to calculate an α metric for a trellis stage from α metrics retrieved from the memory area 64 and corresponding to the previous trellis stage and is arranged to complete this calculation, and store the resulting α metric into the memory area 64, all in a single clock cycle.

The operation of the AMCU 48 will now be described by reference to the case where metric $\alpha_2$ is being calculated for stage t of the trellis of FIG. 2. In this case, $\alpha_1$ and $\alpha_3$ of stage t-1 are retrieved from the memory area 64 and are applied, via lines 66 and 68 respectively, to inputs of adders 52 and 50, respectively.

The other input, 70, of adder 52 is supplied with $\gamma_{1,2}$ evaluated for the transition between stages t-1 and t and the other input, 72, of adder 50 is supplied with $\gamma_{3,2}$ evaluated for the transition between stages t-1 and t. Adder 50 sums its input values and provides the result as its output value. This output value, it will be recalled, is in natural logarithmic form and in fact is the natural logarithm of the product $\alpha_3\gamma_{3,2}$. The output value of adder 50 is applied to one of the inputs of the multiplexer 58 and also to an input of the subtractor 56. Adder 52 operates in a similar manner, summing its input values and providing the result as its output value. This output value is the product $\alpha_1\gamma_{1,2}$ in natural logarithmic form and is supplied to inputs of the multiplexer 58 and the subtractor 56.

The subtractor 56 is configured to subtract the output value of adder 52 from the output of adder 50 and to provide the result as its output value. The sign bit of the output value of the subtractor 56 is then used as a selector signal 65 for the multiplexer 58 and the magnitude bits of the output value of the subtractor are used as an address signal 67 for the LUT 60. The selector signal 65 controls which one of the two input values of the multiplexer 58 is passed to the output of the multiplexer. If the sign bit constituting the selector signal 65 indicates that the result of the subtraction performed by subtractor 56 is positive or zero, then the output of adder 50 becomes the output value of the multiplexer 58. On the other hand, if the sign bit indicates that the subtraction result is negative, the output of adder 52 becomes the output value of the multiplexer 58. In other words, the multiplexer 58 selects the maximum of the outputs of adders 50 and 52.

The address signal 67 selects a value stored in the LUT 60 and causes that value to be read out of the LUT and provided to an input of adder 54. The address signal 67 is the magnitude value k of the result determined by the subtractor 56. The values stored in the LUT 60 are chosen such that the value that is read out in response to address signal k is the natural logarithm of $1+e^{-k}$. The output of the multiplexer 58 is provided to the other input of the adder 54 and the sum value produced by the adder is an estimate of $\alpha_2$ for trellis stage t. The adders 50, 52 and 54 together with subtractor 56, multiplexer 58 and LUT 60 provide an embodiment of the MUO of the logMAP algorithm that is readily implemented in hardware. Further background on the nature of the MUO implementation described here can be found in the paper entitled "Design of Fixed-Point Iterative Decoders for Concatenated Codes with Interleavers", IEEE Journal on Selected Areas in Communications, Vol. 19, No. 5, May 2001, G. Montorsi and S. Benedetto.

The estimate of $\alpha_2$ produced by adder 54 will inevitably contain an error due to the fact that the operands of AMCU 48 are quantised approximations of actual values. Unchecked, this quantisation error would build up as successive trellis stages are processed since the $\alpha$ metrics of each new trellis stage are calculated recursively, by virtue of lines 66 and 68, from the $\alpha$ metrics of the preceding stage. The function of the normaliser 62 is the prevention of this build up, which otherwise could cause saturation of $\alpha$ metrics leading to a loss of information from the turbo decoder 45, leading in turn to a less reliable estimation of the data signal being provided to the information sink 46. The operation of the normaliser 62 will now be described.

Figure 5:
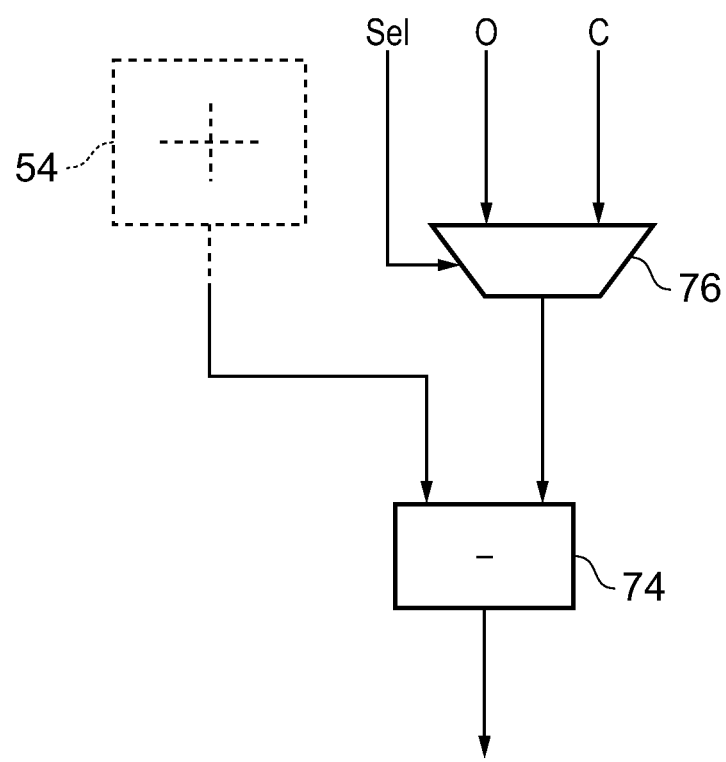
FIG. 5 is a block diagram illustrating schematically a normaliser unit within the metric calculation core of FIG. 4.

The structure of the normaliser 62 is shown in FIG. 5. The normaliser 62 comprises a subtractor 74 and a multiplexer 76. The inputs to the multiplexer 76 are a constant, C, and zero. The inputs to the subtractor 74 are the output of the multiplexer 76 and the first-order corrected version of $\alpha_2$ that is produced by the adder 54. The subtractor 74 is arranged to subtract the output of the multiplexer 76 from the output of the adder 54 in order to produce the final version of $\alpha_2$ for the current trellis stage, which is then stored into the memory area 64. The quantity that the subtractor 74 subtracts from the output value of adder 54 is determined by the multiplexer selection signal Sel. The signal Sel is a single bit signal which causes, if high, the value C to be passed to the output of the multiplexer 76 or, if low, the value zero to be passed to the output of the multiplexer. The creation of signal Sel will now be described with reference to FIG. 6, which illustrates the bank of AMCUs of constituent decoder 47, together with some auxiliary elements.

Figure 6:
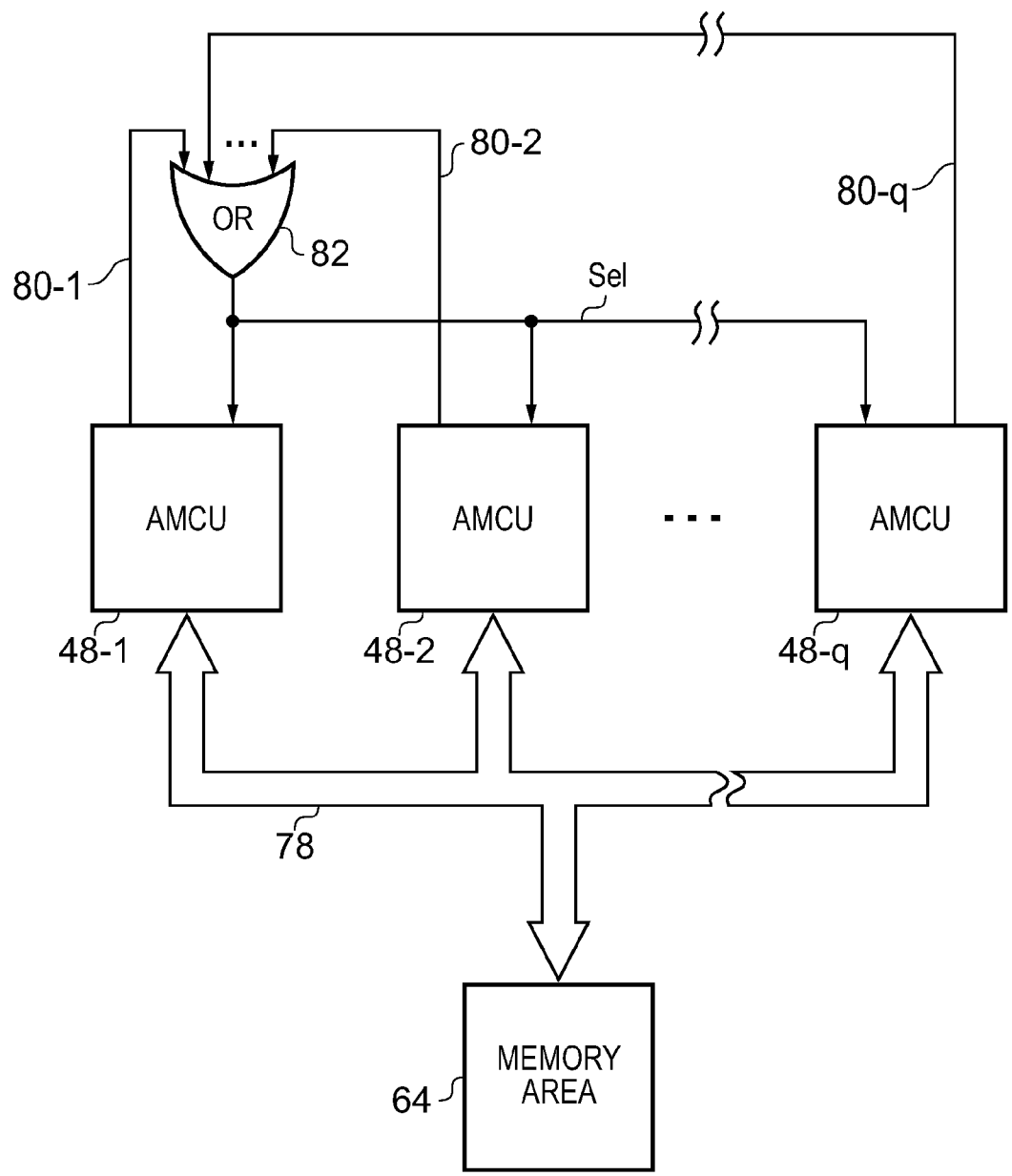
FIG. 6 is a block diagram schematically illustrating a bank of metric calculation cores.

In FIG. 6, there are q AMCUs in the bank, one for each of the q states of the constituent encoder that is the subject of constituent decoder 47. These AMCUs are indicated 48-1 to 48-$q$ and each of them has the same design as AMCU 48 of FIGS. 4 and 5. In a single clock cycle, each of the AMCUs 48-1 to 48-$q$ calculates an a metric for a different one of the q states for a given trellis stage. The AMCUs 48-1 to 48-$q$ are all connected to the memory area 64 for the purpose of retrieving $\alpha$ metrics from and writing $\alpha$ metrics to the memory area 64. The interconnections between memory area 64 and the AMCUs 48-1 to 48-$q$ are shown in simplified form in FIG. 6 as interconnect 78.

In the AMCUs 48-1 to 48-$q$, the $\alpha$ metrics are represented by unsigned binary numbers. Each of the AMCUs 48-1 to 48-$q$ provides on a respective line 80-1 to 80-$q$ the most significant bit (MSB) of the $\alpha$ metric that is input to its normaliser. The q MSBs on lines 80-1 to 80-$q$ are then used as the inputs of a q-input OR gate 82. The output signal of the OR gate 82 is the signal Sel and it is fed in parallel to the normalisers within each of the AMCUs 48-1 to 48-$q$.

Thus, if the MSB of an $\alpha$ metric that is input to a normaliser in one of the AMCUs 48-1 to 48-$q$ becomes high, then each normaliser subtracts C from its input $\alpha$ metric. The MSB of an $\alpha$ metric going high means that saturation of an $\alpha$ metric has either occurred or is soon likely to occur during the processing of subsequent trellis stages. By subtracting the constant C, the normalisers all scale down their subject $\alpha$ metrics by the same amount. It is important to recall that subtracting a constant C from an $\alpha$ metric in natural logarithmic form equates to dividing the non-logarithmic version of the metric by a different constant, $e^C$.

Thus, the operation and constitution of an AMCU have been described, and also the manner in which AMCUs work together in the AMCU bank of constituent decoder 47. The BMCU bank of constituent decoder 47 and the AMCU and BMCU banks of constituent decoder 49 are constituted in the same fashion and work in the same manner as the AMCU bank of constituent decoder 47 and so, for reasons of conciseness, will not be described here.

Figure 7:
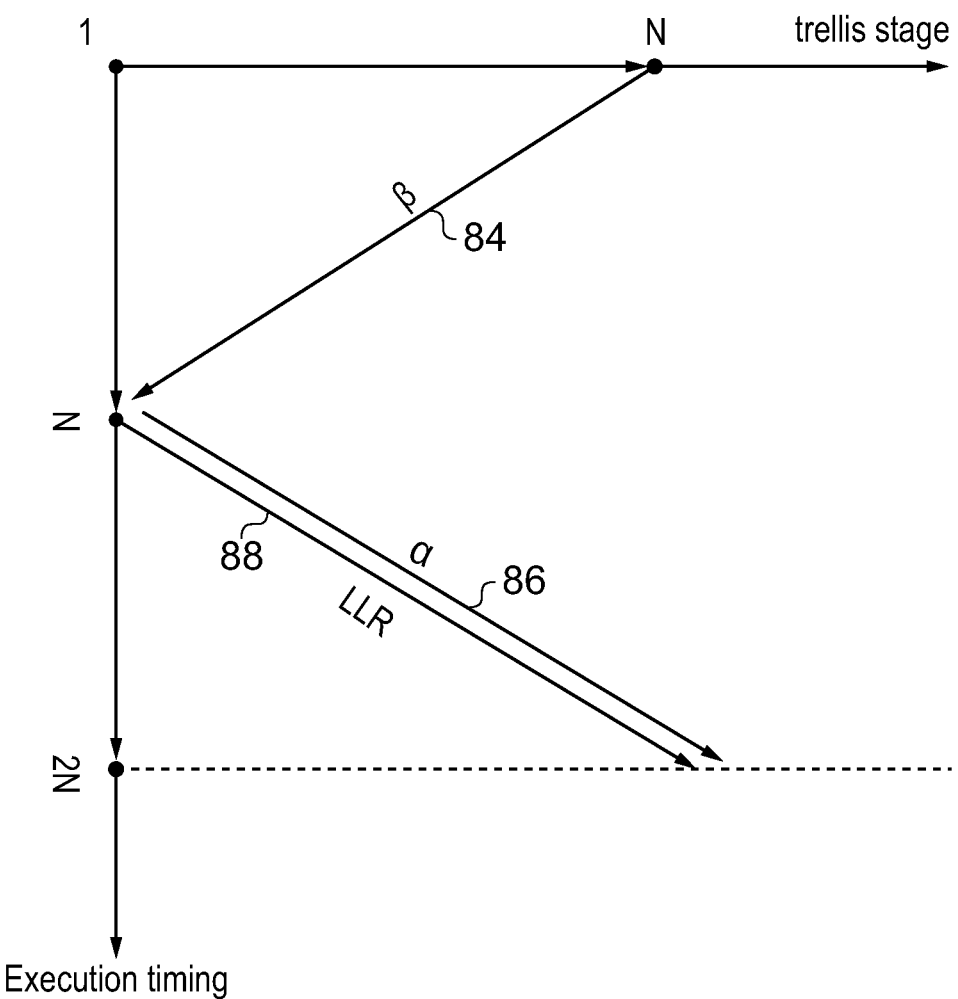
FIG. 7 is a chart illustrating the calculation of α and β metrics and log likelihood ratios in an implementation of the logMAP algorithm using cores of the type shown in FIG. 4.

FIG. 7 shows an execution graph illustrating the calculation of LLRs for a complete iteration of the logMAP algorithm performed on an estimated turbo encoded sequence of N-1 soft bits in length by constituent decoder 47. The stages of the trellis corresponding to the sequence are shown horizontally, running from 1 to N. The execution timing of the algorithm is shown vertically. The $\beta$ metrics are calculated first, commencing in clock cycle 1 at stage N and working back to stage 1. Since the BMCU bank of constituent decoder 47 calculates all of the $\beta$ metrics for a trellis stage in a single clock cycle, the $\beta$ metric calculations are completed in clock cycle N. The $\beta$ metric calculation process is represented by vector 84 in FIG. 7. Once the $\beta$ metric calculations are completed for the trellis, the AMCU bank of the constituent decoder 47 commences, in clock cycle N+1, the calculation of the $\alpha$ metrics from stage 1 to stage N. Since the AMCU bank of constituent decoder 47 calculates all of the $\alpha$ metrics of a trellis stage in a single clock cycle, the $\alpha$ metric calculations are completed in a clock cycle 2N. The $\alpha$ metric calculation process is represented by vector 86 in FIG. 7.

As soon as the $\alpha$ and $\beta$ metrics are available for a trellis stage, the LLR for that stage can be calculated. Accordingly, the constituent decoder 47 is designed to calculate the LLR for a trellis stage in the same clock cycle that the $\alpha$ metrics of that stage are produced. Thus, the LLRs for the current iteration of the logMAP algorithm are produced in clock cycles N+1 to 2N. In FIG. 7, the production of the LLRs is represented by vector 88 (which is actually co-incident with vector 86 but is shown slightly offset for clarity of illustration). It is therefore apparent that constituent decoder 47 takes 2N clock cycles to complete the $\alpha$ metric, $\beta$ metric and LLR calculations for a half iteration of the logMAP algorithm for a trellis of N stages. Since constituent decoder 49 has the same design as constituent decoder 47, it also takes 2N clock cycles to complete the $\alpha$ metric, $\beta$ metric and LLR calculations for an iteration of the logMAP algorithm for a trellis of N stages.

Figure 8:
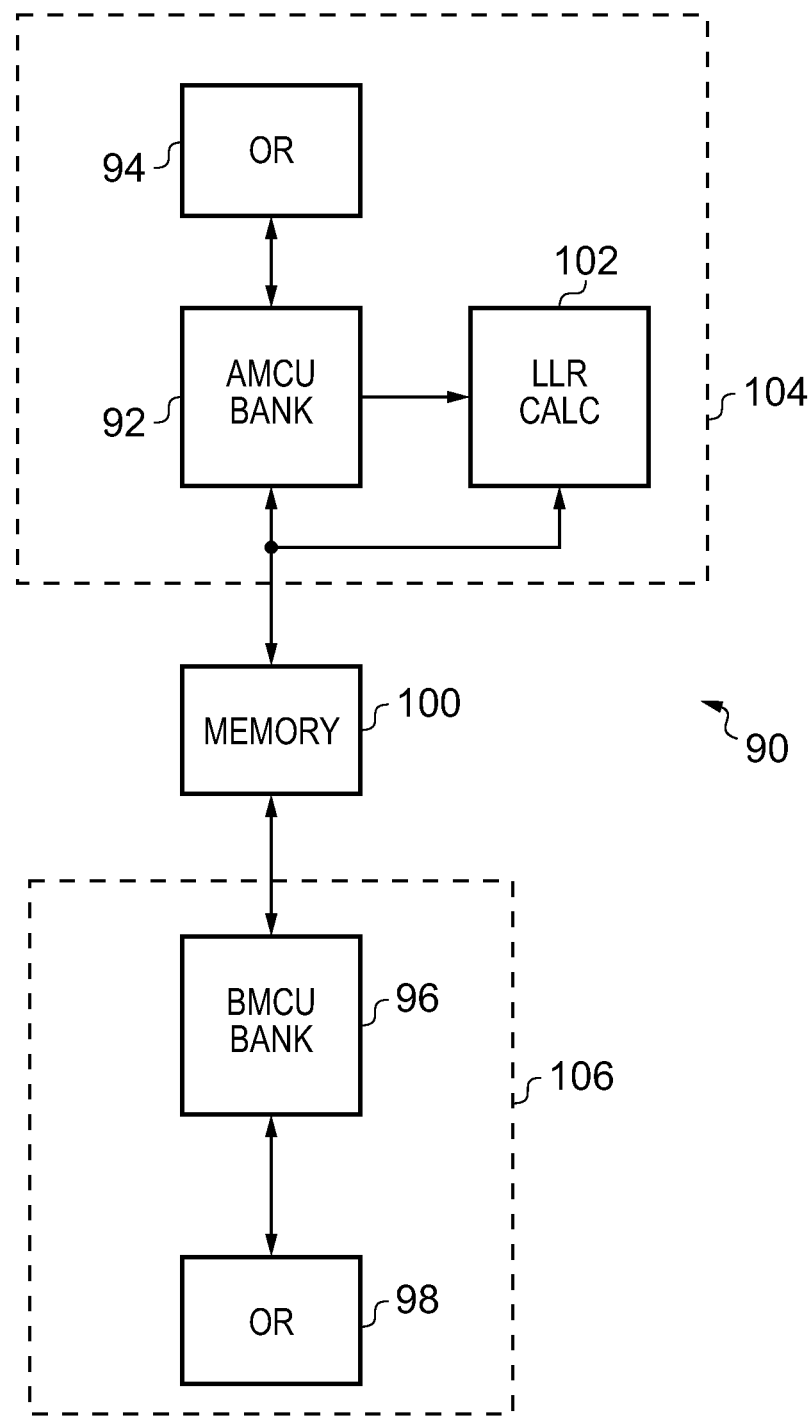
FIG. 8 is a block diagram schematically illustrating a constituent decoder architecture.

FIG. 8 provides a simplified overview of the architecture 90 that is used in each of the constituent decoders 47 and 49 for calculating $\alpha$ and $\beta$ metrics and LLRs. The AMCU bank is indicated 92 and its associated OR gate, for controlling the normalisers within the AMCUs of the AMCU bank 92, is indicated 94. The BMCU bank is indicated 96 and its associated OR gate, for controlling the normalisers with the BMCUs of the BMCU bank 96, is indicated 98. The memory in which the α and β metrics and the LLRs are stored is indicated 100. The LLR calculation unit, that calculates the LLRs from the α and β metrics, is indicated 102. The AMCU bank 92, its associated OR gate 94 and the LLR calculation unit 102 constitute an LLR engine 104 of the architecture 90 and the BMCU bank 96 and its associated OR gate 98 constitute a β metric engine 106 of the architecture 90.

Figure 9:
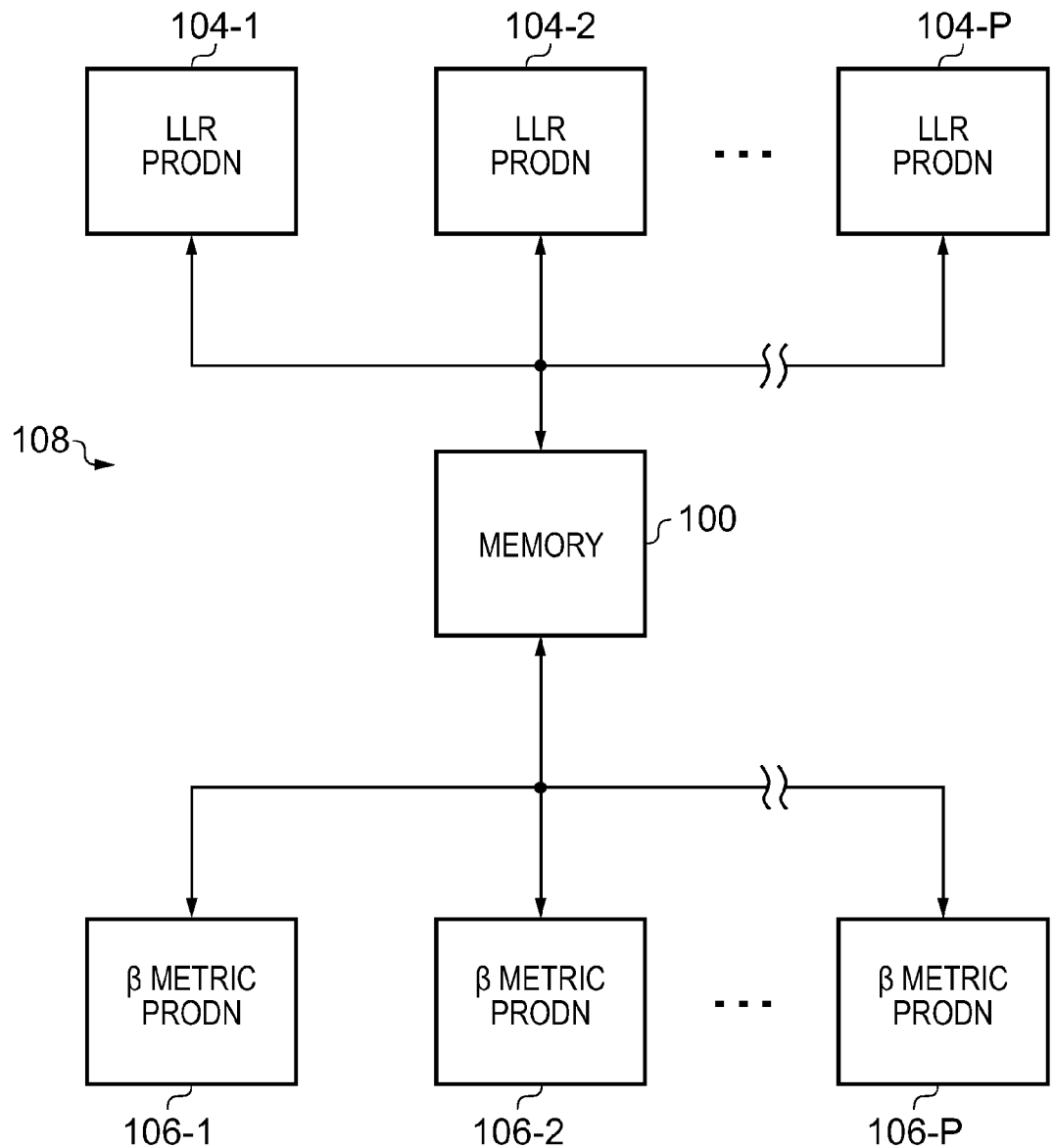
FIG. 9 is a block diagram schematically illustrating another constituent decoder architecture.

FIG. 9 shows an alternative architecture 108 that can be used in constituent decoders 47 and 49 to reduce the number of clock cycles required to perform an iteration of the log-MAP algorithm. Whereas architecture 90 contained a single LLR engine 104 and a single β metric engine 106, architecture 108 contains P instances of each of these regions and uses parallel processing to reduce the clock cycle requirement. In architecture 108, the P LLR engines are labelled 104-1 to 104-P and the P β metric engines are labelled 106-1 to 106-P. Each of the engines 104-1 to 104-P and 106-1 to 106-P is coupled to the memory 100 to allow the storage of LLRs and the storage and retrieval of α and β metrics.

When the architecture 108 is used in logMAP decoding, the trellis is treated in separate segments of length S stages, with α and β metrics and LLRs being calculated for each segment separately from the other segments. To this end, the P β metric engines 106-1 to 106-P work in parallel on different segments of the trellis and the LLR engines 104-1 to 104-P work in parallel on trellis segments that have already been processed by the β metric engines. The timing of the production of LLRs and α and β metrics using architecture 108 will now be described in more detail with the aid of the execution graph of FIG. 10 which assumes that P=4 and that the trellis being processed has N stages.

Figure 10:
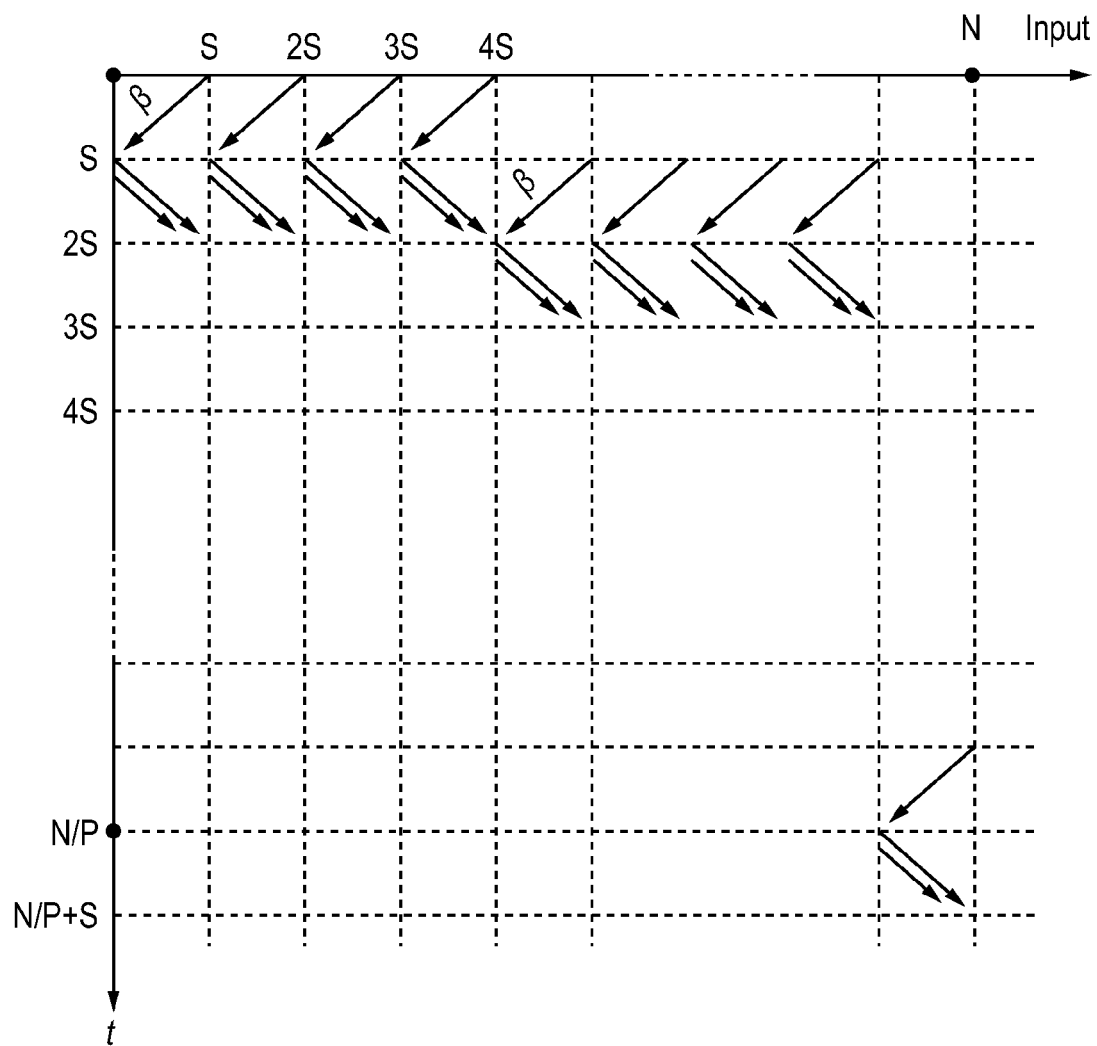
FIG. 10 is a chart illustrating the calculation of α and β metrics and log likelihood ratios in an implementation of the logMAP algorithm using the architecture of FIG. 9 and employing cores of the type shown in FIG. 4 when a windowing approach is used.

As in FIG. 7, the stages of the trellis are arranged horizontally from 1 to N in FIG. 10 and the clock cycles of the execution process are shown vertically. At the outset, the four β metric engines work in parallel on the first four segments of the trellis up to stage 4S. Since each β metric engine can calculate the entire set of β metrics of a trellis stage in a single clock cycle, and because the β metric engines are operating in parallel, the β metrics for the four segments are completed in S clock cycles. The β metric engines then move on to calculating β metrics for next four segments, running from stage 4S+1 to 8S, whilst the LLR engines simultaneously work in parallel on the first four trellis segments, running from stage 1 to 4S, using the β metrics that were produced in clock cycles 1 to S for the part of the trellis running from stage 1 to 4S. Thus, over clock cycles S+1 to 2S, LLRs are produced for the trellis segments running from stage 1 to 4S and β metrics are produced for the trellis segments running from stage 4S+1 to 8S. In the next S clock cycles, the LLR engines produce LLRs for the four trellis segments for which the β metric engines produced β metrics in the previous S clock cycles whilst the β metric engines are calculating β metrics for the next four trellis segments, and so the process continues until all of the LLRs have been calculated for the trellis. In FIG. 10, the production of β metrics for a trellis segment is indicated by a reverse/downward arrow and combined α metric and LLR production for a trellis segment is indicated by a double forward/downward arrow. The overlap of the β metric and LLR production and the parallel processing of trellis segments is readily apparent in the figure.

The process of calculating the entire set of LLRs for an N stage trellis using the architecture of FIG. 9 requires N/P+S clock cycles. There is a limit to how small S can be made since if it is made too small, the reliability of the LLRs calculated for a trellis segment will become too low. The limit below which S should not go can be determined readily by persons skilled in the field of digital communications having regard to the conditions in which the architecture is expected to be used. The lower limit on S therefore imposes an upper limit on P (at which N/P falls to the lower limit for S) but otherwise the higher the value of P, the quicker the LLR calculations can be concluded.

The architecture 108 provides a so-called parallel sliding window implementation of the logMAP algorithm. If it is desired to increase the speed of architecture 108, then the number P of pairs of β and LLR engines is increased as necessary.

Another modification that can be made to the architecture of the constituent decoders 47 and 49 shall now be described with reference to FIG. 11. This modification can be used with or in place of the modifications described with reference to FIG. 9.

Figure 11:
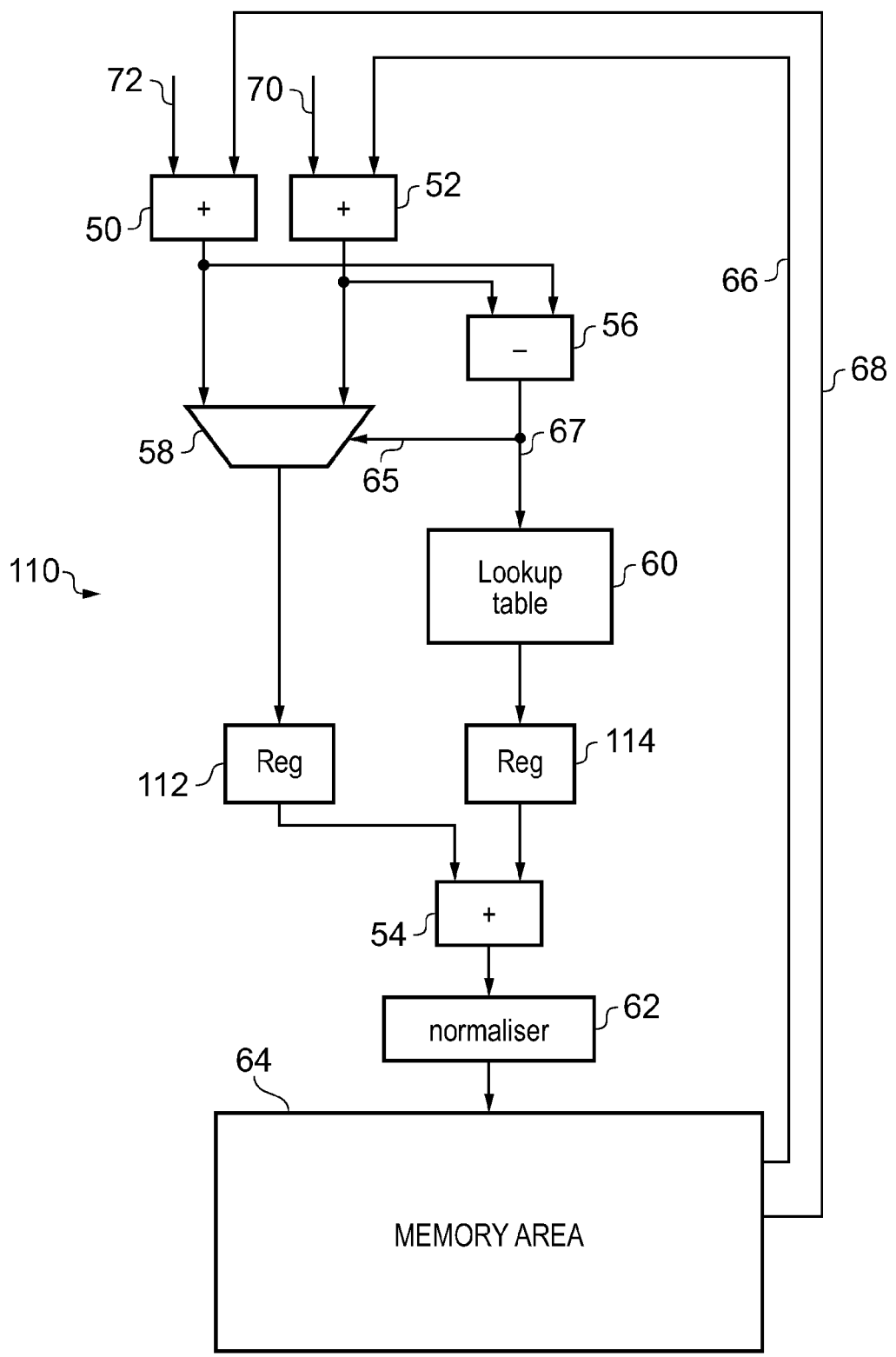
FIG. 11 is a block diagram illustrating schematically another type of metric calculation core that can be used in place of the core shown in FIG. 4.

FIG. 11 shows a modified AMCU 110 based on AMCU 48 of FIG. 4. Elements of AMCU 48 that are re-used in AMCU 110 retain the reference numerals given in FIG. 4 and their nature shall not be described again here. AMCU 110 has a register 112 inserted between the multiplexer 58 and adder 54 and another register 114 inserted between LUT 60 and adder 54. This modification permits two clock cycles to be used for the production of an α metric. In a first clock cycle α metrics are retrieved from memory area 64 and are processed through adders 50 and 52 and the subtractor 56, the multiplexer 58 and the LUT 60 perform their operations, with the outputs of the multiplexer and the LUT being stored in registers 112 and 114 respectively at the end of the clock cycle. In the second clock cycle, the contents of registers 112 and 114 are added in adder 54 and the result is processed through the normaliser 62 and the written into the memory area 64. The sequence of operations that is performed in the first clock cycle shall be called a coarse calculation sequence (CCS) since at the end of the sequence a coarse value of the α metric under calculation is stored into register 112. The sequence of operations that is performed in the second clock cycle shall be called a quantisation correction sequence (QCS) since it is in this sequence that quantisation errors affecting the α metric calculation are controlled.

Given the α metric calculation performed by AMCU 10 is split over two clock cycles, pipelining can be introduced to the α metric calculation. That is to say, in one clock cycle, the AMCU 110 can perform the CCS for one α metric of a trellis stage and can perform the QCS for another α metric of that stage. Thus, the number of AMCUs within the AMCU bank of each LLR engine can be halved, saving considerable resources within FPGA 44. In order to maintain data throughput, however, the clock rate of the architecture must be doubled compared to that used in FIG. 4.

Additional registers can be inserted into the AMCU architecture of FIG. 11 so as to divide the α metric calculation process into more than two sequences. For example, registers could be provided at the outputs of adders 50 and 52 and/or a register could be provided between the adder 54 and the normaliser 62. Where sufficient registers are inserted to break the α metric calculation process into F sequences, then the number of AMCUs in an AMCU bank of an LLR engine is reduced by a factor of F, although the clock rate needs to be increased by a factor of F to maintain data throughput. The same principles apply also to BMCUs.

Figure 12:
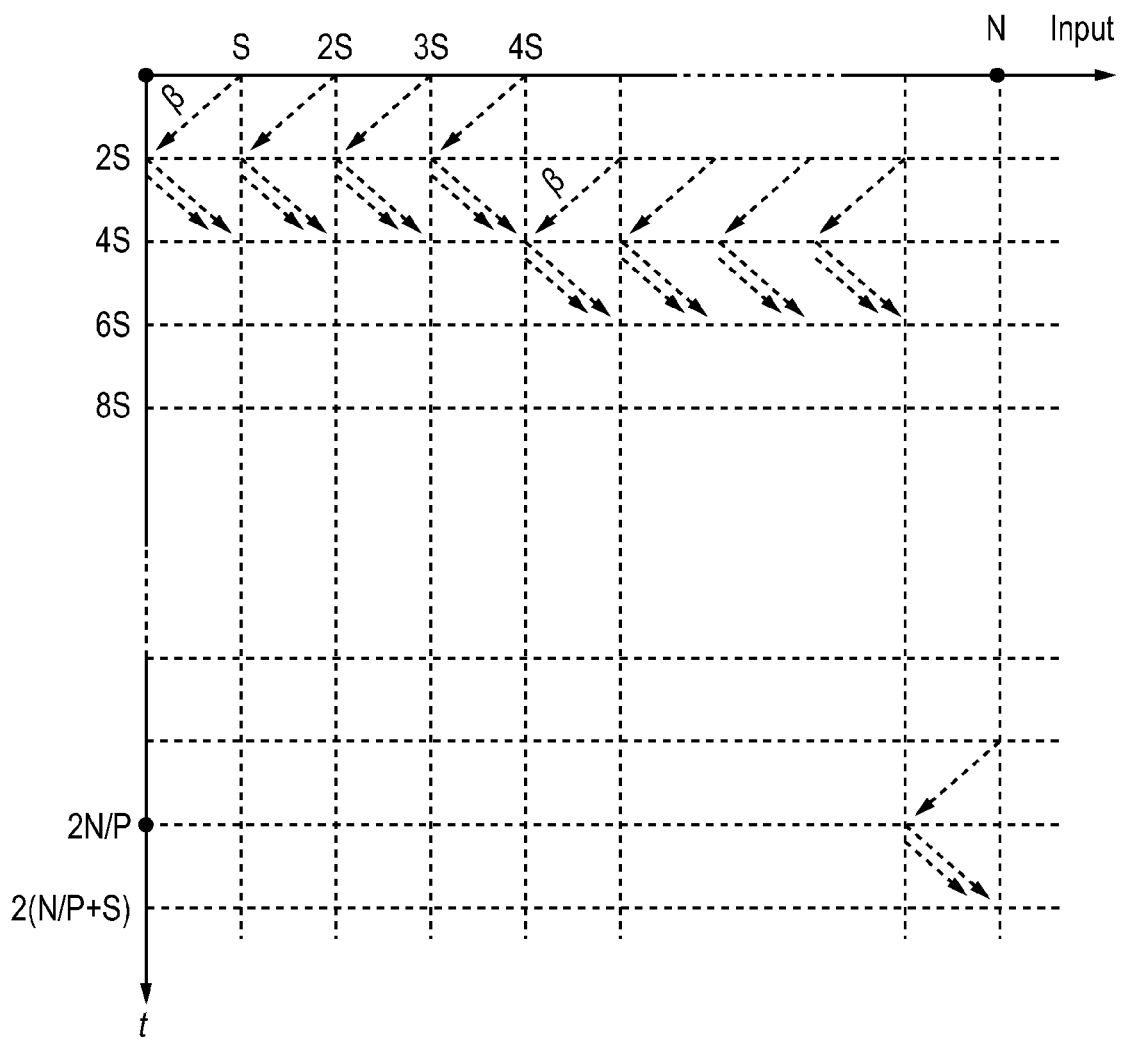
FIG. 12 is a chart illustrating the calculation of $\alpha$ and $\beta$ metrics and LLRs (log likelihood ratios) in an implementation of the logMAP algorithm when metric calculation cores of the type shown in FIG. 7 are used.

FIG. 12 demonstrates the application of the modification of FIG. 11 to the architecture of FIG. 9 in the case where F=2, P=4 and the trellis being processed has N stages. As in FIGS.

7 and 10, the trellis stages are shown horizontally and the execution cycles are shown vertically in FIG. 12. Here, the β metric calculations for a trellis segment of S stages in length is shown as a reverse/downward arrow that, to indicate the pipelining, is in dashed form. The combined α metric and LLR production for a trellis segment is shown by a double forward/downward arrow that, to indicate the pipelining, is shown in dashed form. The LLR calculation process is completed in F(N/P+S) clock cycles.

Figure 13:
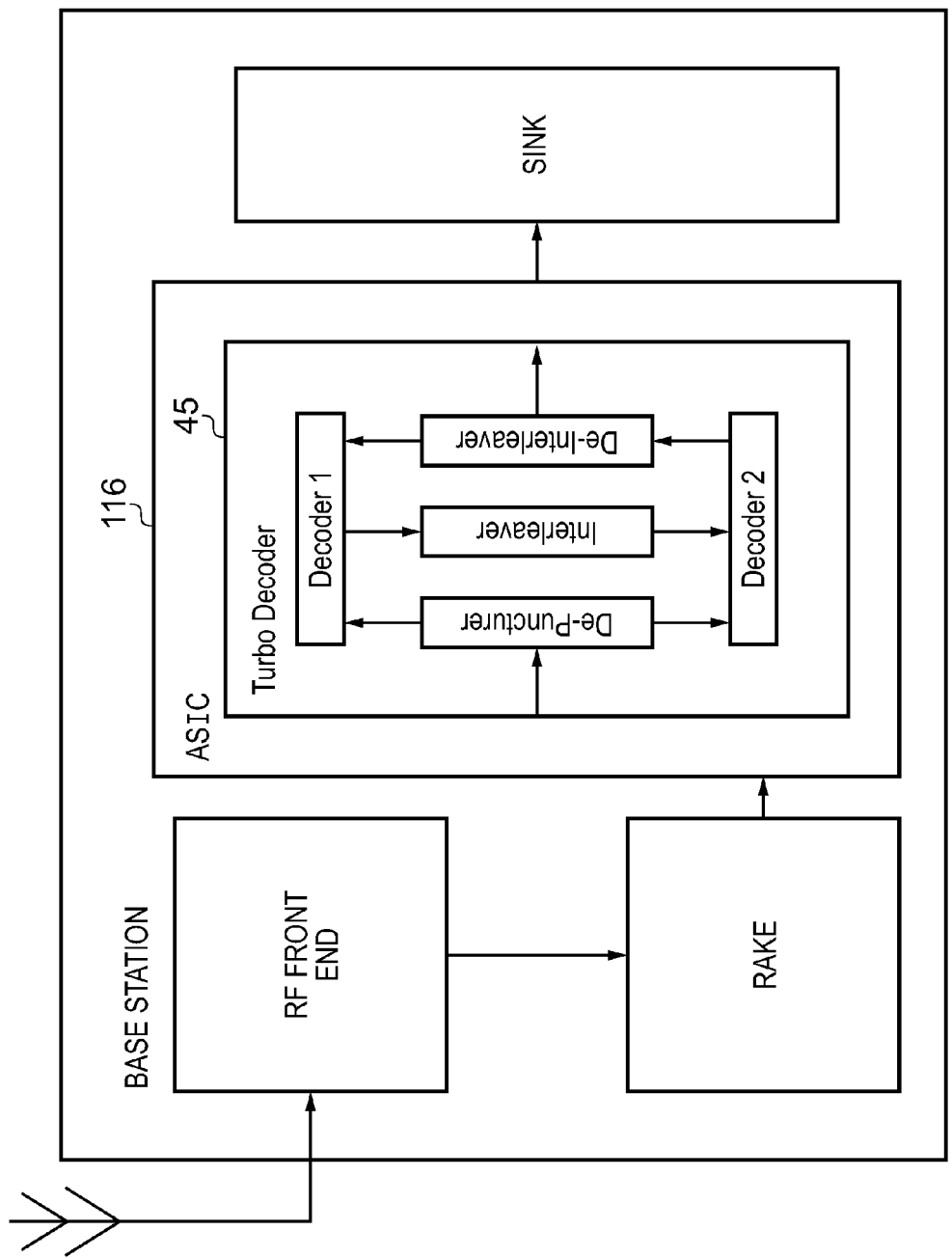
FIG. 13 illustrates a UMTS base station implementing, in an ASIC, a turbo decoder using cores of the type illustrated in FIG. 7.

So far, this document has discussed turbo decoder designs implemented in FPGAs. Of course, it will be apparent to readers skilled in the digital communications field that the turbo decoder designs described in this document could be implemented in other data processing technologies. FIG. 13 provides an example of this, where the turbo decoder 45 of FIG. 3 is implemented in an ASIC 116 instead of an FPGA.

The constituent decoder designs discussed in the Detailed Description up to this point utilise the logMAP algorithm. However, these designs are readily adapted to the MAP algorithm. The necessary modifications will be apparent to persons skilled in the field of digital communication but the fundamental change is that according to the MAP algorithm the α and β metrics and the branch metrics would be handled in non-logarithm form. For example, one result of this would be that adders 50 and 52 would need to be replaced with multipliers; the other requisite changes will be apparent to persons skilled in the art. For the avoidance of doubt, it is stated that the optimisations described in relation to FIGS. 9 and 11 are entirely applicable to MAP decoders.

Of course, the technology described in the various constituent decoder architectures described up to this point can also be used in different contexts. For example, the technology can be applied to hard output Viterbi decoders, soft output Viterbi decoders and other types of maximum likelihood sequence estimators and in equalizers. Taking as an example the context of a hard output Viterbi decoder, the operations performed by adders 50 and 52 and multiplexer 58 would constitute an add-compare-select (ACS) operation for the calculation of a path metric of a trellis stage, with the selection signal 65 being the traceback information pertaining to the calculated metric. Alternatively, if LUT 60 is omitted from the MUO described in FIGS. 4 and 11, the MUO then relates to the max-logMAP algorithm rather than the logMAP algorithm.

This document has discussed architectures for constituent decoders in a turbo decoder but it is to be understood that these convolutional decoder architectures are not limited in applicability to the field of turbo decoding.

This document has discussed data processing techniques for data recovery in the context of signals acquired by a base station but it will be appreciated that these techniques are not limited to this context. For example, the data processing techniques described in this document could be applied in the context of a mobile telephone handset acquiring a convolutionally encoded signal, a Viterbi equaliser in a signal receiver or a convolutionally encoded signal read from a hard disk drive.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiments but, on the contrary, is intended to cover various modifications and equivalent arrangements included within the scope of the appended claims.

In summary, the present invention is only limited in its scope by the appended claims, to which reference should now be made.

What is claimed is:

1. A state metric calculator for calculating state metrics of stages in a trellis of a sequence estimation technique, the calculator comprising:
a processing path containing operations needed for calculating a state metric of a trellis stage from state metrics of an earlier trellis stage and at least one data store in the processing path so that the path is partitioned into sections that are arranged to operate on the calculation of different state metrics to one another;
wherein:
a first of said sections is arranged to select a candidate from candidates for a state metric of said trellis; and
a second of said sections is arranged to correct inaccuracy in the candidate selected by the first section, wherein the second section compares at least two of the candidates, further wherein selection of the candidate by the first section is based on a comparison of the at least two candidates by the second section,
further wherein at least two of said sections are arranged to work on, in a single clock cycle, production of different state metrics of a same trellis stage of the trellis.

2. A state metric calculator according to claim 1, wherein: one of said at least one data store is connected between said first and second sections.

3. A state metric calculator according to claim 2, wherein the first and second sections work on, in a single clock cycle, the production of different state metrics of the trellis.

4. A state metric calculator according to claim 1, wherein said operations relate to the production of a maximum a posteriori probability (MAP) algorithm state metric, being one of an α metric and a β metric.

5. A state metric calculator according to claim 1, wherein said operations are operations in a logarithmic domain.

6. A state metric calculator according to claim 1, wherein the first of said sections is arranged to select a best one of a number of candidates for a state metric of said trellis and the second of said sections is arranged to calculate an inaccuracy in the state metric selected in the first section.

7. A state metric calculator according to claim 6, wherein said first section is arranged to derive the candidates from branch metrics for transitions between stages of the trellis and state metrics of a trellis stage preceding the trellis stage to which the candidates pertain.

8. A state metric calculator according to claim 6, wherein said second section is arranged to combine with said best candidate a correction obtained by addressing a look up table with the difference of a pair of candidates deduced by the first section.

9. A state metric calculator according to claim 8, wherein said second section is arranged to scale said best candidate in conjunction with application of a same scaling to state metrics being calculated in at least one other state metric calculator.

10. A state metric calculator according to claim 6, wherein said second section is arranged to scale said best candidate in conjunction with application of a same scaling to state metrics being calculated in at least one other state metric calculator.

11. A constituent decoder of a turbo decoder, the constituent decoder comprising a state metric calculator according to claim 1.

12. A state metric calculator according to claim 1, implemented in an application specific integrated circuit (ASIC).

13. A state metric calculator according to claim 1, implemented in a field programmable gate array (FPGA).

14. A data sequence estimator for estimating a transmitted data sequence, the estimator comprising at least one state metric calculator according to claim 1.

15. A radio communications receiver comprising a data sequence estimator according to claim 14.

16. A base station for a radio telecommunications network, the base station comprising a radio communications receiver according to claim 15.

17. A satellite communications receiver, the satellite communication receiver comprising a radio communications receiver according to claim 15.

18. A state metric calculator according to claim 1, wherein the second section compares the at least two of the candidates using a subtractor.

19. A state metric calculator according to claim 1, wherein the second section uses results of the comparison to determine a correction amount by which to adjust the candidate and combines the candidate with the correction amount, further wherein the correction amount and the candidate are stored before being combined with each other.

20. A state metric calculator according to claim 19, wherein the second section combines the candidate with the correction amount using an adder, further wherein the correction amount and the candidate are stored in respective registers before being combined with each other.

21. A state metric calculator for calculating a state metric of a stage of a trellis having a plurality of stages and relating to a sequence estimation technique, the calculator comprising:
 a set of processing elements; and
 at least one register,
 wherein the processing elements are arranged to take data from a trellis stage and produce a state metric for a subsequent stage of the trellis and at least one register of said at least one register is connected between two of the processing elements to divide the set into subsets that are capable of working on production of different state metrics, of said subsequent stage, to one another in a given clock cycle;
 wherein:
 a first of the processing elements is arranged to select a candidate from candidates for a state metric of said trellis; and
 a second of the processing elements is arranged to correct inaccuracy in the candidate selected by the first processing element, wherein the second of the processing elements compares at least two of the candidates, further wherein selection of the candidate by the first of the processing elements is based on a comparison of the at least two candidates by the second of the processing elements.

22. A state metric calculator that is pipelined to enable different parts of the calculator to be working on different state metrics at the same time, wherein:
 a first section of the state metric calculator is arranged to select a candidate from candidates for a state metric of a trellis;
 a second section of the state metric calculator is arranged to correct inaccuracy in the candidate selected by the first section, wherein the second section compares at least two of the candidates, further wherein selection of the candidate by the first section is based on a comparison of the at least two candidates by the second section; and
 at least one register between the first and second sections, wherein the first and second sections are arranged to work on, in a single clock cycle, production of different state metrics of a same trellis stage of the trellis.

23. A data sequence estimator for estimating a transmitted data sequence using a trellis calculation technique utilising a trellis comprising a set of stages each containing a number of states, the estimator comprising:
 a plurality of state metric calculators, wherein:
 each of at least two of the state metric calculators comprises a processing path containing operations needed for calculating a state metric of a trellis stage from state metrics of an earlier trellis stage and at least one data store in the processing path so that the path is partitioned into sections that are arranged to operate on calculation of different state metrics to one another;
 each of said at least two state metric calculators is arranged to produce, in one clock cycle, a state metric for a different state of the same stage of the trellis; and
 each of said at least two state metric calculators is arranged such that, in said clock cycle, at least two of its processing path sections work on the calculation of different state metrics to one another;
 wherein:
 a first of said sections is arranged to select a candidate from candidates for a state metric of said trellis; and
 a second of said sections is arranged to correct inaccuracy in the candidate selected by the first section, wherein the second section compares at least two of the candidates, further wherein selection of the candidate by the first section is based on a comparison of the at least two candidates by the second section.

* * * * *